US010163691B2

(12) United States Patent
Shih et al.

(10) Patent No.: US 10,163,691 B2
(45) Date of Patent: *Dec. 25, 2018

(54) LOW-K DIELECTRIC INTERCONNECT SYSTEMS

(71) Applicant: Taiwan Semiconductor Manufacturing Co., Ltd., Hsinchu (TW)

(72) Inventors: Po-Cheng Shih, Hsin Chu (TW); Chia Cheng Chou, Keelung (TW); Chung-Chi Ko, Nantou (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/707,657

(22) Filed: Sep. 18, 2017

(65) Prior Publication Data

US 2018/0005882 A1 Jan. 4, 2018

Related U.S. Application Data

(63) Continuation of application No. 15/168,596, filed on May 31, 2016, now Pat. No. 9,768,061.

(51) Int. Cl.
*H01L 21/768* (2006.01)
*H01L 21/3105* (2006.01)
*H01L 21/311* (2006.01)

(52) U.S. Cl.
CPC .... *H01L 21/76825* (2013.01); *H01L 21/3105* (2013.01); *H01L 21/31144* (2013.01); *H01L 21/76802* (2013.01)

(58) Field of Classification Search
CPC combination set(s) only.
See application file for complete search history.

(56) References Cited

U.S. PATENT DOCUMENTS

| | | | |
|---|---|---|---|
| 6,309,956 B1 | 10/2001 | Chiang et al. | |
| 7,282,458 B2 | 10/2007 | Gates et al. | |
| 7,482,265 B2 | 1/2009 | Chen et al. | |
| 8,039,179 B2 | 10/2011 | Shieh et al. | |
| 8,129,269 B1* | 3/2012 | Bao | H01L 21/02126 257/E21.273 |
| 8,202,681 B2 | 6/2012 | Lin et al. | |
| 8,728,332 B2 | 5/2014 | Lin et al. | |
| 8,822,243 B2 | 9/2014 | Yan et al. | |
| 9,130,017 B2* | 9/2015 | Shih | H01L 21/76811 |
| 2006/0091468 A1 | 5/2006 | Liaw | |
| 2007/0015355 A1* | 1/2007 | Lin | H01L 21/76825 438/624 |
| 2007/0257323 A1 | 11/2007 | Tsui et al. | |
| 2008/0160782 A1* | 7/2008 | Yamazaki | H01L 21/02126 438/761 |
| 2008/0188074 A1* | 8/2008 | Chen | H01L 21/7682 438/623 |

(Continued)

*Primary Examiner* — Mamadou Diallo
(74) *Attorney, Agent, or Firm* — Haynes and Boone, LLP

(57) ABSTRACT

A method of fabricating a semiconductor device includes forming a low-k dielectric layer over a substrate and depositing a cap layer over the low-k dielectric layer. A treatment process is performed to the cap layer. After the treatment process to the cap layer is performed, the low-k dielectric layer is etched to form a plurality of trenches using the cap layer as an etching mask.

20 Claims, 15 Drawing Sheets

(56) References Cited

U.S. PATENT DOCUMENTS

| | | |
|---|---|---|
| 2011/0281208 A1 | 11/2011 | Lin et al. |
| 2012/0278776 A1 | 11/2012 | Lei et al. |
| 2013/0295769 A1* | 11/2013 | Lin .................... H01L 21/0274 |
| | | 438/692 |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |

* cited by examiner

LOW-K DIELECTRIC INTERCONNECT SYSTEMS

PRIORITY DATA

The present application is a continuation application of U.S. patent application Ser. No. 15/168,596, filed May 31, 2016, entitled "LOW-K DIELECTRIC INTERCONNECT SYSTEMS," issuing as U.S. Pat. No. 9,768,061, which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (e.g., line) that can be created using a fabrication process) has decreased.

ICs may comprise electronic components, such as transistors, capacitors, or the like, formed on a substrate. Interconnect structures, such as conductive features (e.g., conductive lines, contacts, vias), are then formed over the electronic components to provide connections between the electronic components and to provide connections to external devices. To reduce the parasitic capacitance of the interconnect structures, the interconnect structures may be formed in low-k dielectric layers including a low-k dielectric material (e.g., a dielectric material having a k value lower than 3.8, lower than 3.0, or lower than 2.5). The width of the interconnect structures continually decreases, causing difficulties in the metal filling process forming the interconnect structures in low-k dielectric layers.

Accordingly, a method to address the above issues is needed.

BRIEF DESCRIPTION OF THE DRAWINGS

Aspects of the present disclosure are best understood from the following detailed description when read with the accompanying figures Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
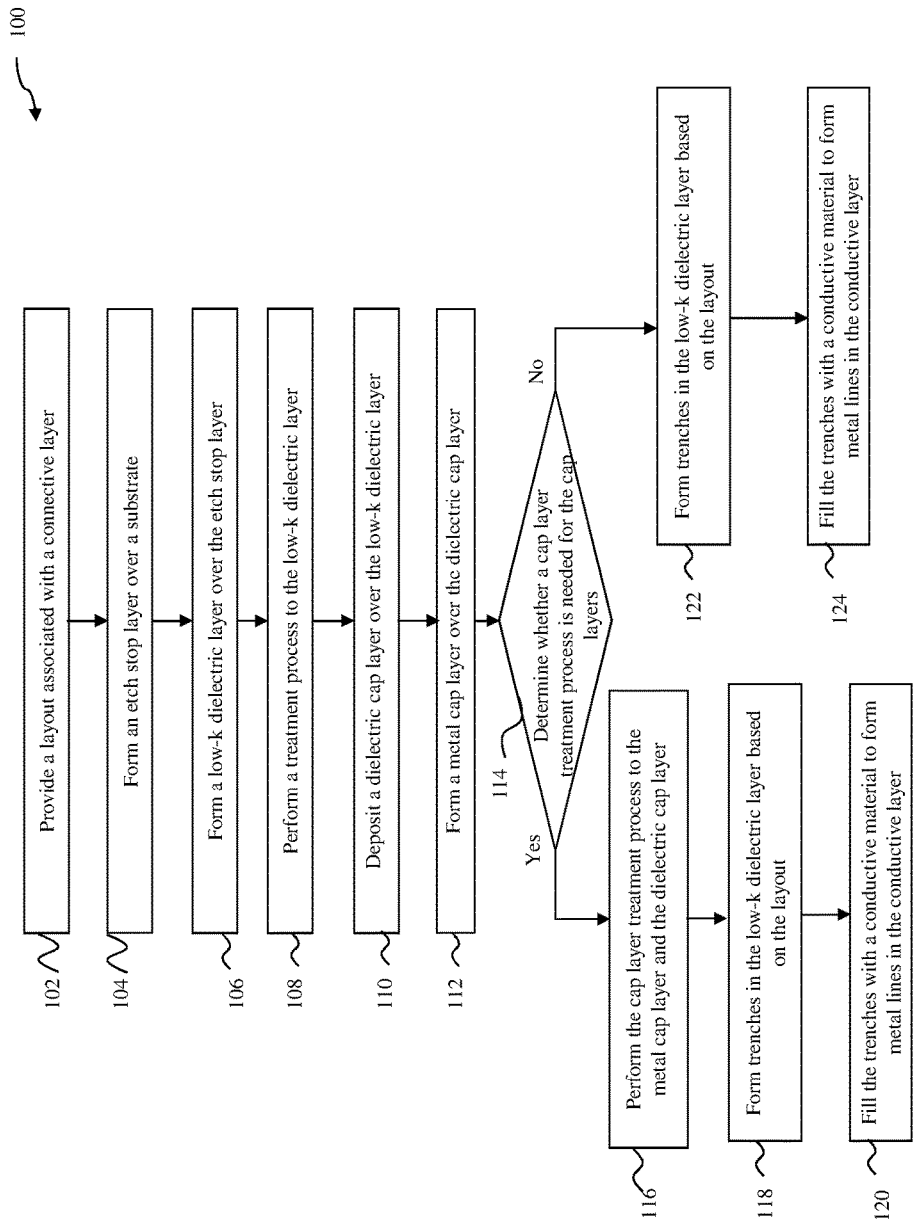
FIG. 1 is a flowchart illustrating an embodiment of a method of forming a semiconductor device or portion thereof according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Different stress types such as normal stress, compressive stress, tensile stress, and internal stress may be used herein to describe stresses in a layer and/or multilayers. Normal stress (also referred to as stress) may refer to a force applied perpendicularly on a unit area of a material. Normal stress may be compressive stress or tensile stress. Compressive stress is a type of stress on a material that may lead to contraction of the material, meaning the length of the material tends to decrease in the compressive direction. Compressive stress is opposite from tensile stress, which is a type of stress on a material that may lead to expansion of the material, which means that the length of the material tends to increase in the tensile direction. The value of the normal stress may be negative if it is compressive stress, and may be positive if it is tensile stress. A layer operable to deliver a compressive stress to layers above and/or below (either in direct contact or not) may be referred to as a compressive layer. A layer operable to deliver a tensile stress to layers above and/or below (either in direct contact or not) may be referred to as a tensile layer. Internal stress may refer to the stresses in equilibrium inside a layer without an external force.

Figure 2:
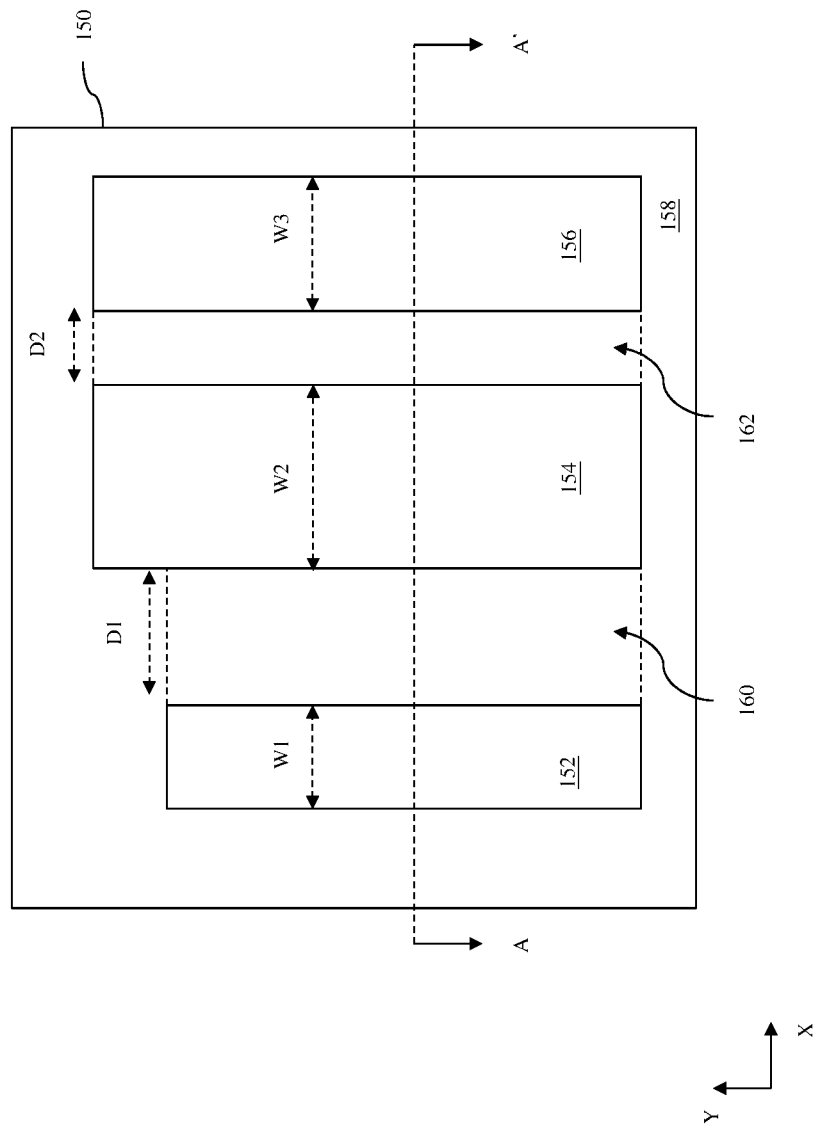
FIG. 2 is a layout of a portion of a semiconductor device according to an embodiment of the present disclosure.

Referring to FIG. 1, illustrated therein is a flowchart of one embodiment of a method 100 used to fabricate a semiconductor device. The method 100 begins at block 102, where a layout of a connective layer in an interconnect structure (e.g., a multi-layer interconnect (MLI) structure) of an IC device is provided. Referring to FIG. 2, illustrated is an exemplary layout 150 of a connective layer in an interconnect structure of a device. In some examples, the interconnect structure is an MLI structure. In some examples, the interconnect structure is a post-passivation structure. A device associated with the layout 150 may be fabricated using the method 100. The following discussion presents exemplary areas and dimensions for various areas in the layout 150. These areas and dimensions are exemplary only and are not intended to be limiting beyond what is specifically recited in the claims that follow.

In the example of FIG. 2, the layout 150 may include patterns 152, 154, and 156 and an insulating area 158, which may define conductive features (e.g., conductive lines, contacts, vias) and insulating areas of a connective layer of the device. For example, the patterns 152, 154, and 156 may define conductive features in the connective layer. For further example, the insulating area 158 may define an insulating layer (e.g., including a low-k dielectric material) that surrounds the conductive features defined by the patterns 152, 154, and 156, and electrically insulates portions of those conductive features. In some embodiments, a subsequent patterning process is performed using the layout 150 to define the conductive features and the insulating layer of the connective layer.

As illustrated in FIG. 2, in some embodiments, the patterns 152, 154, and 156 have widths W1, W2, and W3 respectively. In an embodiment, each of the widths W1, W2, and W3 of the patterns 152, 154, and 156 may be between about 15 nanometers (nm) and about 100 nm. In some embodiments, the insulating area 158 may include areas 160 and 162 interposing neighboring patterns. For example, the area 160 may interpose neighboring patterns 152 and 154 in the X direction. For further example, the area 162 may interposes neighboring patterns 154 and 156 in the X direction. The areas 160 and 162 may have widths D1 and D2 respectively. In some embodiments, each of the widths D1 and D2 of the areas 160 and 162 may be between about 8 nm to about 40 nm. In some embodiments, each of the widths D1 and D2 may be less than about 20 nm (e.g., equal to or less than about 10 nm).

Referring to FIG. 1, the method 100 proceeds to block 104, where an etch stop layer is formed over a substrate. The substrate may include a plurality of features such as, semiconductor devices, interconnect structures, and/or other suitable features upon which the etch stop layer is formed.

Figure 3:
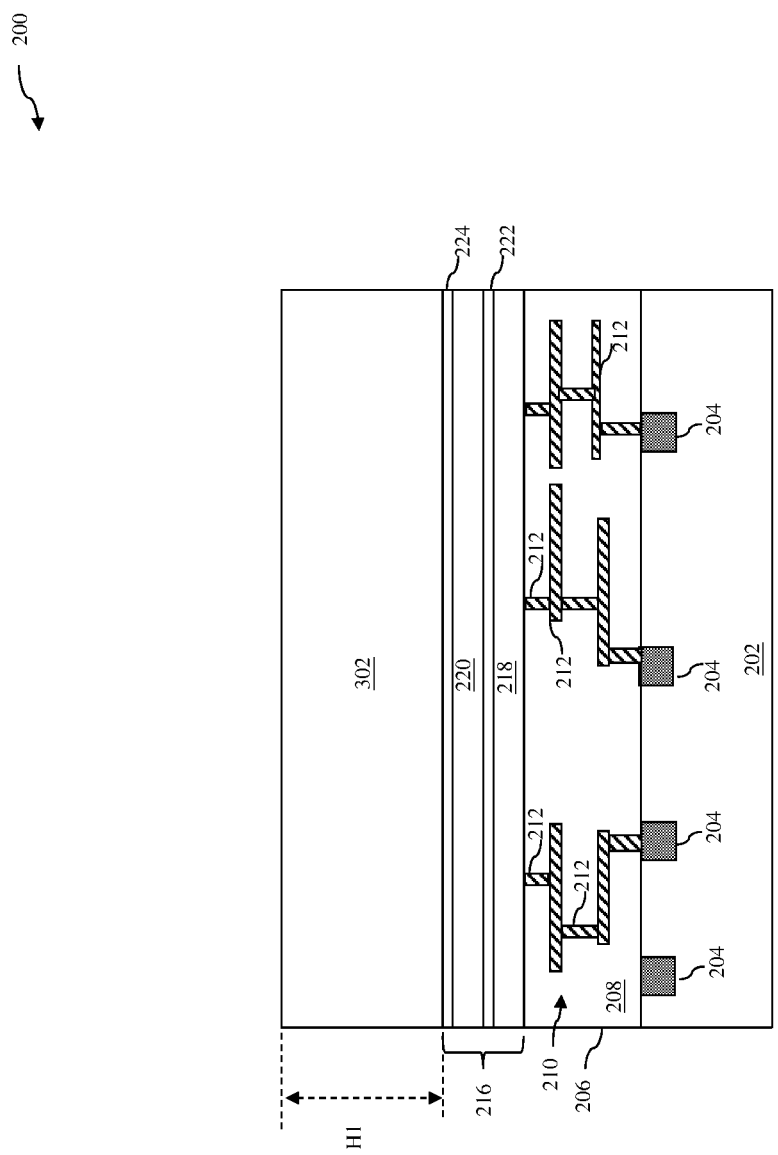
FIG. 3 is a cross-sectional view of a portion of a semiconductor device after forming an etch stop layer and a low-k dielectric layer according to some embodiments.

Referring to the example of FIG. 3, a device 200 is provided. The device 200 includes a substrate 202 (also referred to as a wafer), a plurality of semiconductor devices 204 formed in or on the substrate 202, an interconnect structure 206 formed over one side of the substrate 202. An etch stop layer 216 may be formed over a top surface of the substrate 202. The etch stop layer 216 is discussed in further detail below.

The substrate 202 may be a semiconductor substrate such as a silicon substrate. The substrate 202 may include various layers, including conductive or insulating layers formed over a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, the substrate may optionally include an epitaxial layer (epi-layer), may be strained for performance enhancement, may include a silicon-on-insulator (SOI) structure, and/or have other suitable enhancement features.

The semiconductor devices 204 formed in or on the substrate 202 may include active components such as Field Effect Transistors (FETs) or Bipolar Junction Transistors (BJTs), or passive components such as resistors, capacitors, or inductors. The device 200 may include millions or billions of these semiconductor devices, but only a few are shown in FIG. 3 for the sake of simplicity.

As illustrated in the example of FIG. 3, in some embodiments, an interconnect structure 206 is formed over the substrate 202. The interconnect structure 206 includes a plurality of patterned dielectric layers and connective layers that provide interconnections (e.g., wiring) between the various doped features, circuitry, and input/output of the device 200. For example, the interconnect structure 206 includes an interlayer dielectric (ILD) 208 and a multilayer interconnect (MLI) structure 210. The ILD 208 may include silicon oxide, low-k dielectric material, other suitable dielectric materials, or combinations thereof.

In some embodiments, the MLI structure 210 may include conductive interconnect features such as conductive features (e.g., conductive lines, contacts, and/or vias). For purposes of illustration, a plurality of conductive features 212 is shown in FIG. 3. It is noted that the conductive features 212 illustrated are merely exemplary, and the actual positioning, quantity, and configuration of the conductive features 212 may vary depending on design and manufacturing needs. The MLI structure 210 includes conductive features formed by suitable methods including physical vapor deposition (PVD), chemical vapor deposition (CVD), atomic layer deposition (ALD), plating, sputtering and/or other suitable processes. The MLI structure 210 may be defined by suitable processes such as photolithography and etching processes. The conductive features of the MLI structure 210 may include multiple layers such as, barrier layers, seed layers, adhesion layers, and/or other suitable features. In an embodiment, the MLI structure 210 includes conductive features 212 of copper. Other suitable compositions for the MLI structure 210 includes aluminum, aluminum/silicon/copper alloy, metal silicide (such as nickel silicide, cobalt silicide, tungsten silicide, tantalum silicide, titanium silicide, platinum silicide, erbium silicide, palladium silicide, or combinations thereof), copper alloy, titanium, titanium nitride, tantalum, tantalum nitride, tungsten, polysilicon, gold, silver, and/or combinations thereof.

As indicated above, in some embodiments, an etch stop layer 216 may be formed over the substrate 202. As illustrated in the example of FIG. 3, the etch stop layer 216 is disposed over the interconnect structure 206. Alternatively, the interconnect structure 206 may be omitted in the device 200, and the etch stop layer 216 may be formed directly over the substrate 202. The etch stop layer 216 may include a dielectric material, such as silicon nitride, silicon oxynitride, silicon carbide, other suitable materials, and/or a combination thereof. In some examples, the etch stop layer 216 may include multiple layers, including a silicon nitride layer, a silicon carbon nitride layer, a silicon oxynitride layer, other suitable layers, and/or a combination thereof. In the example of FIG. 3, the etch stop layer 216 includes a first etch stop layer 218 disposed over the interconnect structure 206, and a second etch stop layer 220 disposed over the first etch stop layer 218. In some examples, the first etch stop layer 218 includes aluminum nitride (AlN). In some examples, the second etch stop layer 220 includes aluminum oxide ($Al_2O_3$). In some examples, the etch stop layer 216 may include an oxygen doped silicon carbide (ODC) layer 222 interposed between the first etch stop layer 218 and the second etch stop layer 220. In some embodiments, the etch stop layer 216 may include an ODC layer 224 disposed over the second etch stop layer 220. The etch stop layer 216 may be formed by chemical vapor deposition (CVD), spin-on coating, plasma-enhanced chemical vapor deposition (PECVD) process and/or other suitable deposition or oxidation processes.

Referring to FIG. 1, in an embodiment, the method 100 then proceeds to block 106, where a low-k dielectric layer is formed over the etch stop layer. Referring to the example of FIG. 3, a low-k dielectric layer 302 may be formed by depositing a low-k dielectric material over the etch stop layer 216. Low-k materials may include dielectric materials that have a dielectric constant (k) lower than that of $SiO_2$ (e.g., 3.9). The low-k dielectric material may include carbon containing materials, organo-silicate (OSG) glass, porogen-containing materials, a hydrogen silsesquioxane (HSQ) dielectric material, a methylsilsesquioxane (MSQ) dielectric material, a carbon doped oxide (CDO) dielectric material, a hydrogenated silicon oxy-carbide (SiCOH) dielectric material, a benzocyclobutene (BCB) dielectric material, an arylcyclobutene based dielectric material, a polyphenylene based dielectric material, other suitable materials, and/or a combination thereof.

In various embodiments, the low-k dielectric layer 302 may be deposited using a chemical vapor deposition (CVD) method, plasma enhanced CVD (PECVD), low pressure CVD (LPCVD), atomic layer chemical vapor deposition (ALCVD), spin-on coating, and/or other suitable deposition processes. In some embodiments, the low-k dielectric layer 302 may have a thickness H1 between about 20 nm and about 200 nm. In some embodiments, the height H1 is between about 40 nm and about 60 nm.

Referring to FIG. 1, the method 100 then proceeds to block 108, wherein a treatment process is performed to the low-k dielectric layer. The treatment process may include an ultraviolet (UV) treatment process, an e-beam treatment process, a thermal treatment, other suitable treatment process, and/or a combination thereof. The treatment process may be performed in a production tool that is also used for PECVD, atomic layer deposition (ALD), LPCVD, etc.

Figure 4:
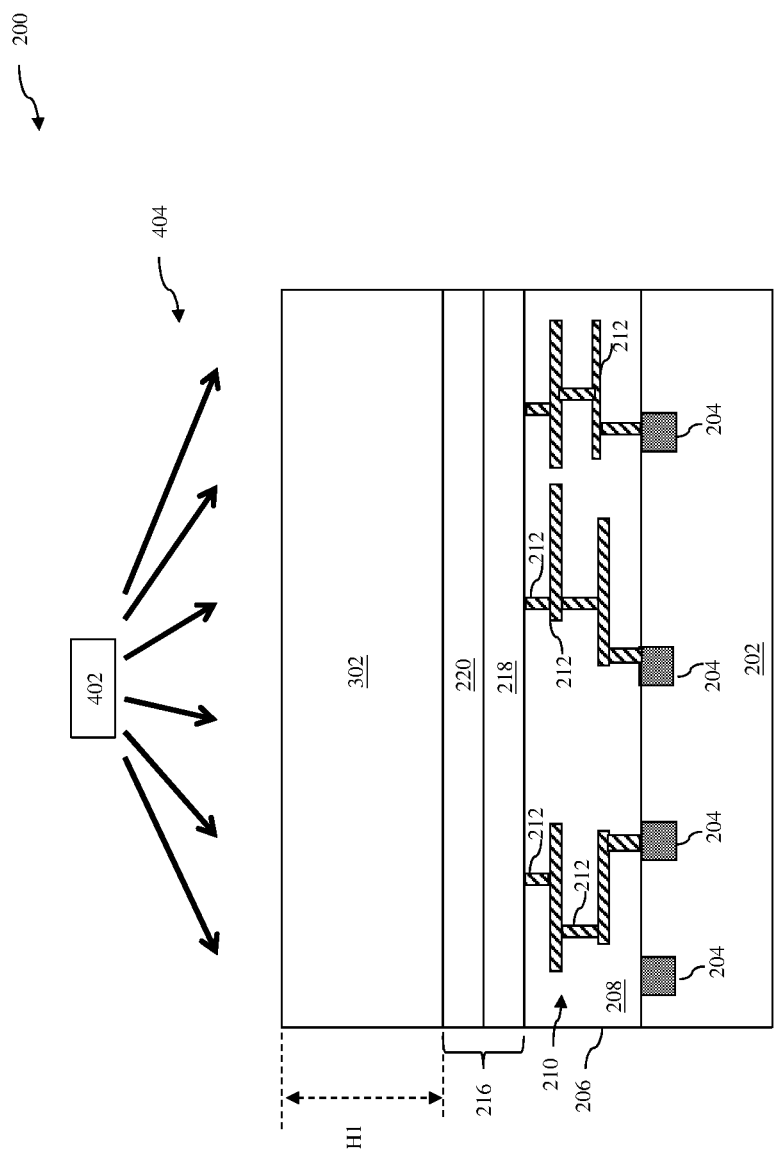
FIG. 4 is a cross-sectional view of a portion of a semiconductor device where a treatment process is performed to a portion of a semiconductor device according to some embodiments.

Referring to the example of FIG. 4, in some embodiments, the treatment process includes a UV treatment process performed to the low-k dielectric layer 302. A UV source 402 is used to irradiate the low-k dielectric layer 302 with UV radiation 404. The UV source 402 may be a single wavelength excimer lamp or a broad spectrum source with arc or microwave excitations. In some embodiments, a filter may be used to selectively remove undesired wavelengths from the UV radiation 404. In some embodiments, the UV exposure may be performed in a vacuum environment or in an environment containing process gases such as $H_2$, $N_2$, inert gases (e.g., He, Ne, Ar, Kr, Xe, Rn), and combinations thereof. In some embodiments, the UV treatment process may be controlled (e.g., by controlling the radiation wavelength(s), exposure time, power intensity, temperature, pressure) so that the treated low-k dielectric layer 302 has desired properties (e.g., porosity, hardness, dielectric constant k). In some embodiments, the UV treatment drives porogen out of the low-k dielectric layer 302, thereby forming pores, improving the mechanical property, and/or reducing the dielectric constant of the low-k dielectric layer 302. In some embodiments, the UV treatment may improve the porosity of low-k dielectric layer 302 by about at least 15%. In some examples, a UV wavelength may be determined such that exposure to the wavelength forms a cross linked dielectric in the low-k dielectric layer 302 (e.g., by converting Si—O—Si bonding from a cage-like structure to a network structure). In some examples, the UV treatment increases the hardness and/or elastic modulus of the low-k dielectric layer 302. In some examples, after the UV treatment, the low-k dielectric layer 302 may have a hardness between about 1 Gpa and 2 Gpa. In some examples, the UV treatment increases the hardness of the low-k dielectric layer 302 (e.g., by between about 10% to about 20%). In some examples, the UV treatment reduces the k value of the low-k dielectric layer 302 (e.g., by more than about 10%). In some embodiments, the UV radiation 404 has a wavelength between about 150 nm to about 300 nm (e.g., less than about 250 nm). In some embodiments, the UV radiation 404 includes multiple wavelengths between about 150 nm and about 300 nm. In some examples, the UV treatment is performed using a wafer temperature of between about 250° C. and about 450° C. (e.g., about 350° C.), and a process time of between about 20 seconds and about 300 seconds (e.g., about 60 seconds). In a particular example, the UV treatment uses UV radiation 404 having a wavelength ranging between about 157 nm and about 257 nm, a treatment duration of about 40 seconds, a wafer temperature of about 250° C., and is performed in a vacuum chamber pumped to a pressure less than about $10^{-3}$ torr before applying the UV treatment.

Figure 5:
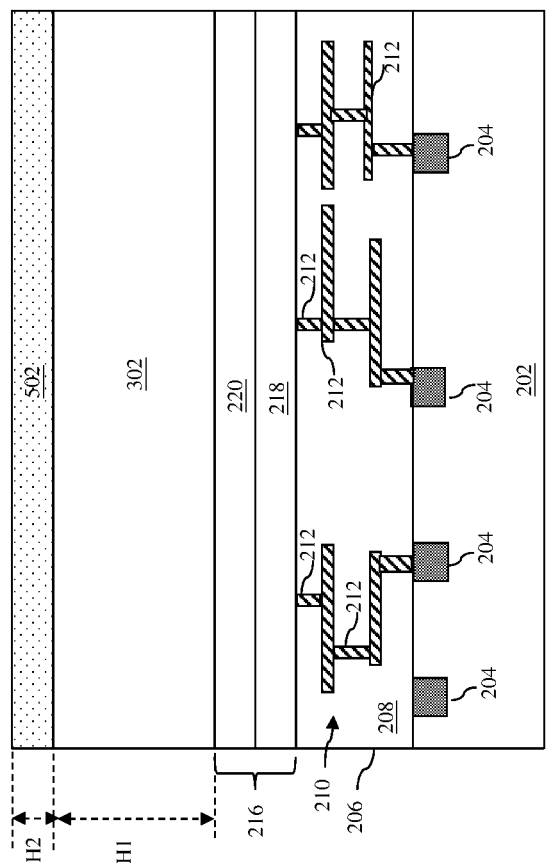
FIG. 5 is a cross-sectional view of a semiconductor device after forming a bottom cap layer according to some embodiments.

Referring to FIG. 1 and the example of FIG. 5, the method 100 then proceeds to block 110, where a bottom cap layer 502 is formed over the low-k dielectric layer 302. In some embodiments, the bottom cap layer 502 includes a dielectric material, such as ODC, silicon nitride, silicon oxynitride, silicon carbide, other suitable materials, and/or a combination thereof. In some embodiments, the bottom cap layer 502 includes a nitrogen free anti-reflection layer (NFARL) including silicon monoxide (SiO). In some embodiments, the bottom cap layer 502 includes silicon oxycarbide (SiOC). In those embodiments where the bottom cap layer 502 includes silicon oxycarbide (SiOC), the bottom cap layer 502 has a weight percent of carbon from about 20% to about 45%, a weight percent of oxygen from about 0% to about 20%, and/or a weight percent of silicon from about 30% to about 50%. In some embodiments, the bottom cap layer 502 includes BC, BN, SiBN, SiBC, SiBCN, and/or other materials including boron. In those embodiments, the bottom cap layer 502 has a weight percent of boron from about 5% to about 100%.

In some embodiments, the bottom cap layer 502 has a height H2 between about 5 nm to about 50 nm (e.g., about 20 nm). In some embodiments, the bottom cap layer 502 may have an internal stress as deposited. In some examples, the bottom cap layer 502 may have a compressive internal stress (e.g., between about −300 MPa and about 0 MPa) as deposited. In some examples, the bottom cap layer 502 may have a tensile internal stress (e.g., between about 0 MPa and about 300 MPa) as deposited. In some embodiments, the bottom cap layer 502 has hardness between about 5 GPa and about 20 GPa.

In some embodiments, the bottom cap layer 502 may be deposited using a chemical vapor deposition (CVD) method, plasma enhanced CVD (PECVD), low pressure CVD (LP-CVD), atomic layer chemical vapor deposition (ALCVD), spin-on coating, and/or other suitable deposition processes.

Figure 6:
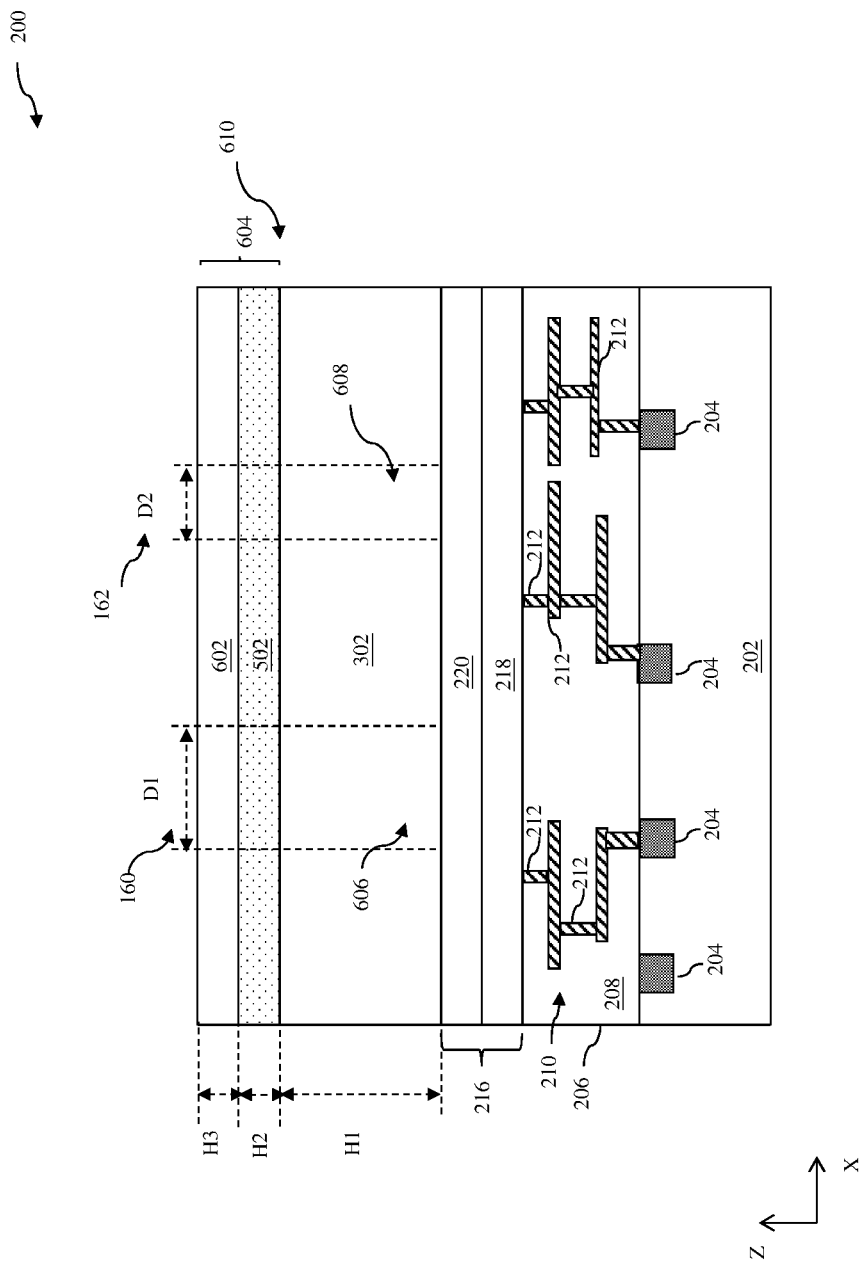
FIG. 6 is a cross-sectional view of a semiconductor device after forming a top cap layer according to some embodiments.

Referring to FIG. 1 and the example of FIG. 6, the method 100 then proceeds to block 110, where a top cap layer 602 is formed over the bottom cap layer 502. The top cap layer 602 may include titanium, titanium nitride, tantalum, tantalum nitride, boron nitride, other suitable materials, and/or combinations thereof. In some embodiments, the top cap layer 602 may be a composite layer. For example, the top cap layer 602 may include a tantalum layer and a tantalum nitride layer disposed over the tantalum layer.

In some embodiments, the top cap layer 602 may have a height H3 between about 5 nm and about 50 nm. In some embodiments, the height H3 is substantially similar to the height H2 of the bottom cap layer 502. In some embodiments, the height H3 is greater than the height H2 but smaller than about two times the height H2. In some embodiments, the height H3 is less than the height H2, but greater than about half of the height H2. In some embodiments, the top cap layer 602 may have an internal stress. In some examples, the internal stress is a compressive internal stress (e.g., between about −800 MPa and about −1,200 MPa). In some examples, the internal stress is a tensile internal stress (e.g., between about 800 MPa to about 1,200 MPa).

In some embodiments, the top cap layer 602 and the bottom cap layer 502 collectively form a cap layer 604. In some embodiments, the cap layer 604 may induce a stress 610 to the low-k dielectric layer 302. In some embodiments, the absolute value of the stress 610 may be greater than about 150 Mpa (e.g., greater than about 350 Mpa). In some examples, the stress 610 is a compressive stress less than about −150 MPa (e.g., less than −350 MPa). In some examples, the stress 610 is a tensile stress greater than about 150 MPa (e.g., greater than about 350 MPa).

In some embodiments, the stress induced by the cap layer 604 to the low-k dielectric layer 302 may be affected by the internal stress of the bottom cap layer 502 and/or the internal stress of the top cap layer 602. In some examples, the bottom cap layer 502 has an internal stress (e.g., between about 0 MPa and about 300 MPa) that is significantly more tensile than the compressive internal stress (e.g., between about −800 MPa and about −1200 MPa) of the top cap layer 602, the compressive internal stress of the top cap layer 602 is partially balanced. As such, the absolute value of the stress 610 applied to the low-k dielectric layer 302 by the cap layer 604 (the top cap layer 602 and the bottom cap layer 502 in combination) may be smaller than the absolute value of the stress applied if no bottom cap layer 502 is formed.

In various embodiments, the top cap layer 602 may be formed using suitable deposition techniques such as ALD, CVD, PVD, plating, sputtering and/or other suitable processes.

Referring to FIG. 1, the method 100 proceeds to block 114, where it is determined whether a cap layer treatment process will be applied to the cap layer 604. In some embodiments, the determination for the cap layer treatment process may be based on various properties of the layout 150, the low-k dielectric layer 302, and the cap layer 604 (including the bottom cap layer 502 and the top cap layer 602). For example, the need for a cap layer treatment process may be determined based on height-to-width aspect ratios of low-k dielectric portions of the low-k dielectric layer 302 that may define low-k dielectric areas disposed between trenches formed in a subsequent step and a height-to-width aspect ratio threshold. In some examples, the height-to-width aspect ratio threshold is between about 3:1 and 10:1. In some examples, the height-to-width aspect ratio threshold is about 5:1.

In some embodiments, it may be determined that a cap layer treatment process is needed where at least one of the low-k dielectric portions of the low-k dielectric layer 302 that may define low-k dielectric areas disposed between the trenches formed in a subsequent step has a height-to-width aspect ratio greater than the height-to-width aspect ratio threshold. Referring to FIG. 6, the low-k dielectric layer 302 includes low-k dielectric portions 606 and 608 associated with the areas 160 and 162 of the layout 150. The low-k dielectric portions 606 and 608 may form low-k dielectric areas disposed between trenches in a subsequent step. In the example of FIG. 6, the low-k dielectric portion 606 has a height-to-width aspect ratio of H1:D1, and the low-k dielectric portion 608 has a height-to-width aspect ratio of H1:D2. In an example, it may be determined that a cap layer treatment process is needed where D1 is about 20 nm, D2 is about 9 nm, H1 is about 50 nm, and the height-to-width aspect ratio threshold is about 5:1, because the low-k dielectric portion 608 has a height-to-width aspect ratio 50:9 that is greater than the height-to-width aspect ratio threshold. In an example, it may be determined that a cap layer treatment process is not needed where D1 is about 20 nm, D2 is about 15 nm, H1 is about 50 nm, and the height-to-width aspect ratio threshold is about 5:1, because both the low-k dielectric portions 606 and 608 have height-to-width aspect ratios (50:20 and 50:15) less than the height-to-width aspect ratio threshold 5:1.

Referring to FIG. 1, after it is determined that a cap layer treatment process is needed at block 114, the method 100 proceeds to block 116, where the cap layer treatment process is performed to the cap layer 604. The cap layer treatment process may include a UV treatment, an e-beam treatment, a thermal treatment, other suitable treatment, and/or a combination thereof. The cap layer treatment process may be performed in a production tool that is also used for PECVD, atomic layer deposition (ALD), LPCVD, etc.

Figure 7:
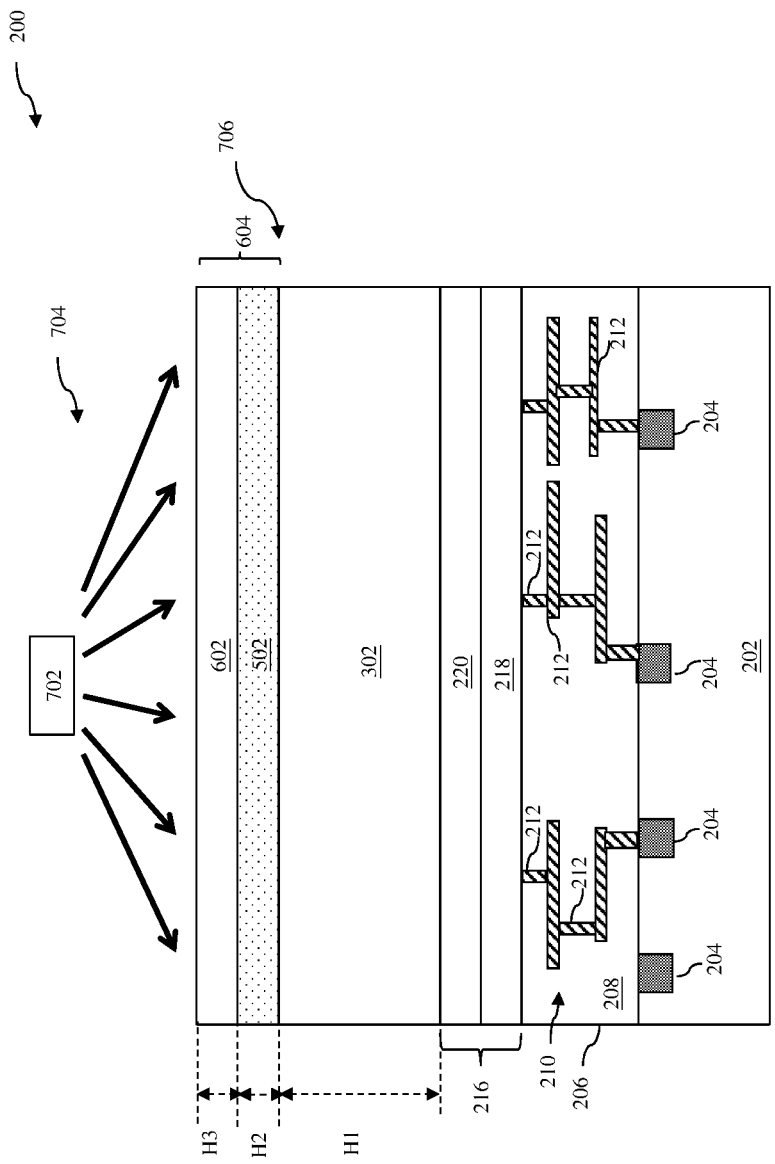
FIG. 7 is a cross-sectional view of a portion of a semiconductor device where a cap layer treatment process is performed to a portion of a semiconductor device according to some embodiments.

Referring to FIG. 7, in some embodiments, the cap layer treatment process includes a cap layer UV treatment performed to the cap layer 604. A UV source 702 is used to irradiate the cap layer 604 with UV radiation 704. The UV source 702 may include one or more single-wavelength excimer lamps or a broad spectrum source with arc or microwave excitations. In some embodiments, a filter may be used to selectively remove undesired wavelengths from the UV radiation 704. The UV treatment parameters (e.g., UV wavelength(s), exposure time, power intensity, temperature, pressure) may be determined based on various properties of the cap layer 604, including various properties of the bottom cap layer 502 (e.g., the thickness H2, the composition, the absorption spectrum, the internal stress, the desired hardness) and the top cap layer 602 (e.g., the thickness H3, the composition, the absorption spectrum, the internal stress). In some embodiments, the UV radiation 704 has a wavelength between about 150 nm to about 300 nm. In some embodiments, the UV radiation 704 includes multiple wavelengths between about 150 nm and about 300 nm. In some examples, the UV treatment process uses a wafer temperature of between about 250° C. and about 450° C., and a process time of between about 20 seconds and about 300 seconds (e.g., about 60 seconds). In some embodiments, the UV treatment may be performed in a vacuum environment or in an environment containing process gases such as $H_2$, $N_2$, inert gases (e.g., He, Ne, Ar, Kr, Xe, Rn), and combinations thereof. In a particular example, the UV treatment includes UV irradiation having a wavelength ranging between about 157 nm and about 257 nm, a treatment duration of about 40 seconds, a temperature of about 250° C., and is performed in a vacuum chamber pumped to a predefined pressure (e.g., between about 3 torr and 30 torr) before applying the treatment. In some embodiments, the UV treatment parameters of the cap layer treatment process are different from the UV treatment parameters applied to the low-k dielectric layer 302 as discussed above with reference to FIG. 4. For example, the UV radiation 704 has a wavelength different from the wavelength of the UV radiation 404 discussed above with reference to FIG. 4.

In some embodiments, the cap layer treatment process may change the internal stress of the bottom cap layer 502. In some embodiments, the cap layer treatment process reduces the absolute value of the internal stress of the bottom cap layer 502. In some embodiments, the cap layer treatment process reduces the absolute value of the internal stress of the bottom cap layer 502. For example, before the cap layer treatment process is performed, the bottom cap layer 502 has a first internal stress, which may be a compressive internal stress or a tensile internal stress. After the cap layer treatment process is performed, the bottom cap layer 502 may have a second internal stress, wherein the second internal stress may be close to the zero stress (neutral stress), a tensile internal stress or a compressive internal stress, where the absolute value of the second internal stress is less than the absolute value of the first internal stress. In some embodiments, the cap layer treatment process increases the absolute value of the internal stress of the bottom cap layer 502. For example, before the cap layer treatment process is performed, the bottom cap layer 502 has a first tensile internal stress (e.g., about 100 MPa). After the cap layer treatment process is performed, the bottom cap layer 502 may have a second tensile internal stress (e.g., about 300 MPa) greater than the first tensile internal stress.

In some embodiments, the cap layer treatment process may change the internal stress of the top cap layer 602. In some embodiments, the cap layer treatment process reduces the absolute value of the internal stress of the top cap layer 602 (e.g., by more than 50%). For example, the absolute value of the internal stress of the cap layer 602 after the cap layer treatment process may be close to the zero (e.g., less than 10 MPa). In some embodiments, the cap layer treatment process increases the absolute value of the internal stress of the top cap layer 602 (e.g., by about 10%).

In some embodiments, the cap layer treatment process changes the stress induced on the low-k dielectric layer 302 by the cap layer 604 (e.g., by changing the internal stress of the bottom cap layer 502 and/or the internal stress of the top cap layer 602). In some embodiments, after the cap layer treatment process is performed, the cap layer 604 may induce a stress 706 to the low-k dielectric layer 302, where the stress 706 is different from the stress 610. In some embodiments, the stress 706 may have an absolute value less than about 150 MPa (e.g., less than about 50 MPa). In some examples, the stress 706 is a compressive stress between about 0 MPa and −150 MPa. In some examples, the stress 706 is a tensile stress between about 0 MPa and 150 MPa. In some examples, the stress 706 may be a stress having an absolute value (e.g., about 150 MPa) that is at least about 50% less than an absolute value (e.g., about 300 MPa) of the stress 610. In some examples, the stress 610 and the stress 706 are stresses of the same type (e.g., both are tensile stresses or compressive stresses). In some embodiments, the stress 610 and the stress 706 are stresses of different types. In an example, the stress 610 is a compressive stress, and the stress 706 is a tensile stress. In another example, the stress 610 is a tensile stress, and the stress 706 is a compressive stress.

In some embodiments, the cap layer treatment process may change the hardness of the bottom cap layer 502. In some embodiments, the cap layer treatment process may increase the hardness of the bottom cap layer 502 by about at least 50% (e.g., from a hardness of about 10 GPa to a hardness of about 15 GPa).

In some embodiments, the cap layer treatment process may not significantly change the properties (e.g., the k value) of the low-k dielectric layer 302, and the properties of the low-k dielectric layer 302 remain substantially the same during the cap layer treatment process. In some examples, the UV radiation 704 is completely absorbed (and/or reflected) by the cap layer 604 and does not reach the low-k dielectric layer 302. In some examples, only a small amount (e.g., less than about 5%) of the UV radiation 704 reaches the low-k dielectric layer 302, which do not cause substantial changes to the properties of the low-k dielectric layer 302. In some examples, the k value of the low-k dielectric layer 302 remains substantially the same during the cap layer treatment process. In some examples, the low-k dielectric layer 302 has a first k value before the cap layer treatment process and a second k value after the cap layer treatment process, and the difference between the first and second k values is less than 5% of the first k value.

Figure 8A:
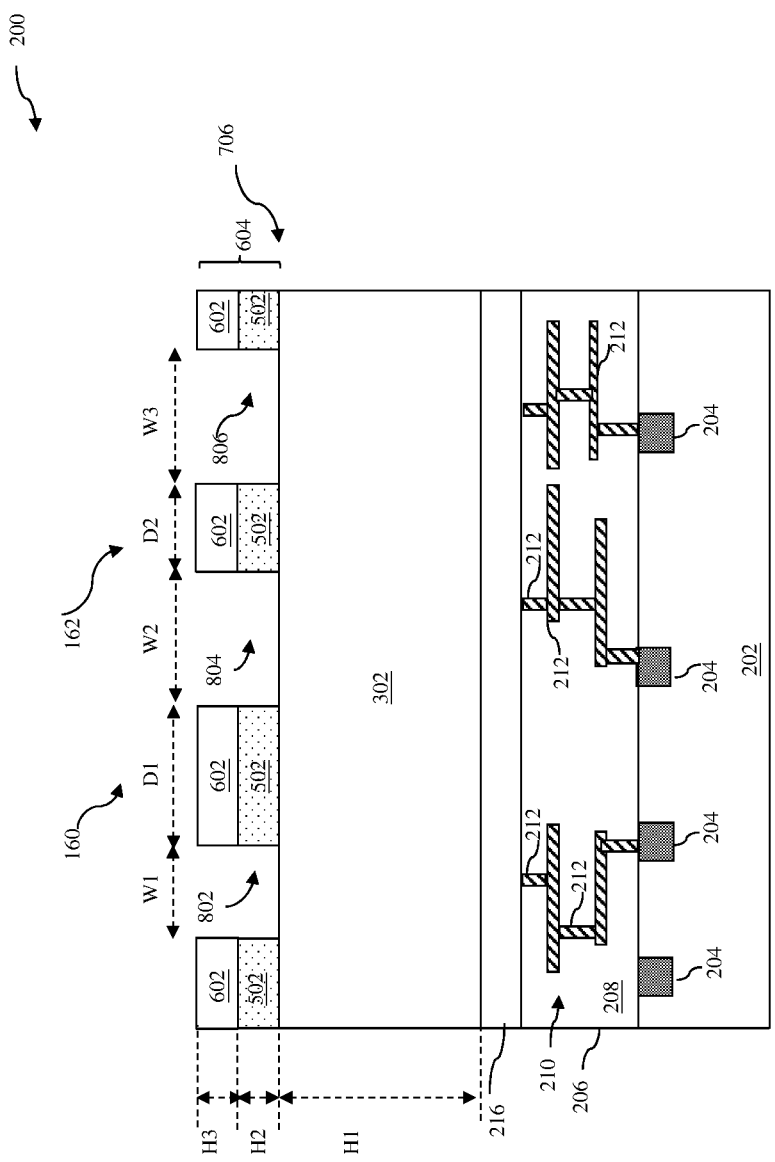
FIG. 8A is a cross-sectional view of a portion of a semiconductor device after openings are formed in the top cap layer and the bottom cap layer according to some embodiments.

Referring to FIG. 1, the method 100 then proceeds to block 118, where trenches are formed in the low-k dielectric layer 302. Referring to FIG. 8A, in some embodiments, a patterning process is performed to the cap layer 604. In some examples, a photoresist layer may be formed over the top cap layer 602 and patterned using the layout 150. The patterned photoresist layer is then used as an etching mask to etch the top cap layer 602 and bottom cap layer 502. As illustrated in the example of FIG. 8A, in some embodiments, the etching may stop on, or over, a top surface of the low-k dielectric layer 302, thereby forming openings 802, 804, and 806 in the top cap layer 602 and the bottom cap layer 502, exposing portions of the top surface of the low-k dielectric layer 302. The opening 802 may have a width W1 and is associated with the pattern 152 of the layout 150. The opening 804 may have a width W2 and is associated with the pattern 154 of the layout 150. The opening 806 may have a width W3 and is associated with the pattern 156 of the layout 150. A portion of the cap layer 604 interposing the openings 802 and 804 may have a width D1 and is associated with the area 160 of the layer 150. A portion of the cap layer 604 interposing the openings 804 and 806 may have a width D2 and is associated with the area 162 of the layer 150. The photoresist layer may be removed (e.g., using a wet etching or plasma ashing process), exposing the patterned top cap layer 602.

Figure 8B:
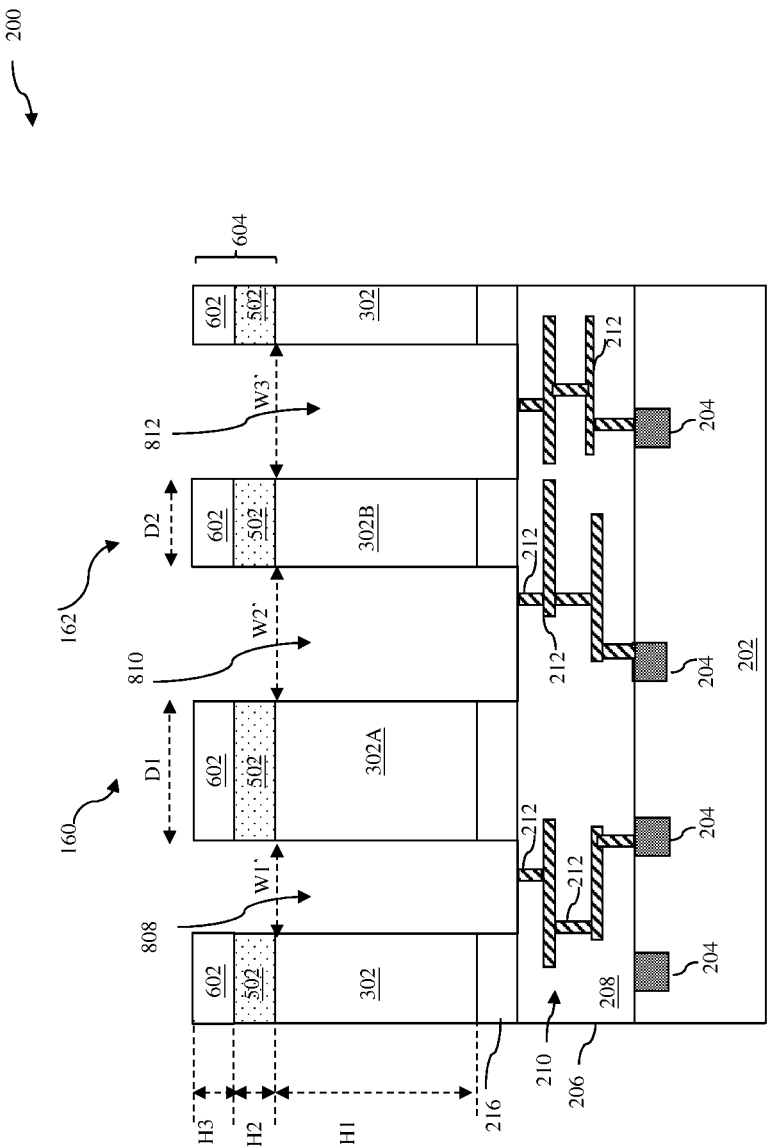
FIG. 8B is a cross-sectional view of a portion of a semiconductor device after trenches are formed in the low-k dielectric layer according to some embodiments.

Referring to FIG. 8B, in some embodiments, an etching may be performed to etch the low-k dielectric layer 302, thereby forming trenches 808, 810, and 812, which are associated with the patterns 152, 154, and 156 of the layout 150 respectively. During the etching process, the patterned top cap layer 602 may be used as the etching mask. The etch process is properly chosen to form the trenches 808, 810, and 812. For example, dry etch, wet etch, or a combination thereof, may be applied for transferring the openings 802, 804, and 806 to the low-k dielectric layer 302, forming the trenches 808, 810, and 812. In some embodiments, the trenches 808, 810, and 812 extend to a bottom surface of the low-k dielectric layer 302 and the etch stop layer 216. In some embodiments, a conductive feature in the MLI structure 210 is exposed in the trenches 808, 810, and 812. In some embodiments, the top cap layer 602 may be removed by etching process, thereby exposing the bottom cap layer 502.

As the width of low-k dielectric areas between neighboring trenches getting smaller, the stress induced by the etching process may cause sidewalls of those low-k dielectric areas defining the trenches to bend, which reduces trench top openings. Such bending of the sidewalls may impact the conductive material filling in the trenches, and cause the distortion of the resulting conductive features and sometimes the breaking of the conductive features. In some embodiments, by performing the cap layer treatment process to the cap layer 604, the bending of sidewalls defining the trenches in the low-k dielectric layer 302 caused by the etching process is reduced. As shown in the example of FIG. 8B, in some embodiments, the portion 302A (also referred to as the low-k dielectric area 302A) and the portion 302B (also referred to as the low-k dielectric area 302B) of the low-k dielectric layer 302 remain substantially upwards during the etching process, which may help ensure the widths of the trenches 808, 810, and 812. In some embodiments, each of the trenches 808, 810, and 812 have substantially straight sidewall profiles. In the example of FIG. 8B, the trenches 808, 810, and 812 have widths W1', W2', and W3' at a top surface of the low-k dielectric layer 302, which may be substantially the same as the widths W1, W2, and W3 of the corresponding openings 802, 804, and 806 of FIG. 8A prior to the etching of the low-k dielectric layer 302. In some examples, the difference between W1' and W1 is less than about 10% (e.g., less than 2%) of the width W1, the difference between W2' and W2 is less than about 10% (e.g., less than 2%) of the width W2, and the difference between W3' and W3 is less than about 10% (e.g., less than 2%) of the width W3. In some examples, the difference between the trench top surface width (e.g., W1') and the corresponding cap layer opening width (e.g., W1) is less than about 1 nm.

In some embodiments, after the trenches 808, 810, and 812 are formed in the low-k dielectric layer 302, a repair treatment process may be performed to the low-k dielectric layer 302 to the damage to the low-k dielectric layer 302 caused by the etching process. In some examples, during the etching of the low-k dielectric layer 302 to form the trenches 808, 810, and 812, a plasma containing oxygen may be used, which may degrade the dielectric properties of the low-k dielectric material of the low-k dielectric layer 302 through oxidation. This damage to the low-k dielectric material may cause an increase of leakage current and dielectric constant k. In some embodiments, a repair treatment process may be performed to repair the damaged low-k dielectric layer 302 (e.g., to increase its dielectric constant). For example, the repair treatment process may include exposing the low-k dielectric layer 302 (e.g., the sidewalls and the bottoms of the trenches 808, 810, and 812) to a UV radiation. In some embodiments, the UV radiation may have a wavelength between about 200 nm and 400 nm, a power density between about 1 W/cm$^2$ and 5 W/cm$^2$, may be performed at a temperature between about 200° C. and about 450° C. for less than about 30 seconds (e.g., 10 seconds). In some embodiments, the repair treatment process may be performed in a vacuum environment or in an environment containing process gases. For example, the process gases may include a gas phase source of methyl (—CH$_3$) groups. For further example, the process gases may include dichlorodimethylsilane (DCDMS), chlorotrim ethylsilane (CTMS), hexamethyldisilazane (HMDS), hexam ethyldisiloxane (HIVIDSO), tetravinyltetramethylcy clotetrasiloxane (TVTMCTS), acetaldehyde, methane, ethane, ethylene, acetylene, and/or combinations thereof. In some embodiments, the UV treatment parameters of the repair treatment process are different from the UV treatment parameters applied to the low-k dielectric layer 302 as discussed above with reference to FIG. 4 and the UV treatment parameters applied to the cap layer 604 as discussed above with reference to FIG. 7. For example, the UV radiation of the repair treatment process has a wavelength different from both the wavelength of the UV radiation 404 discussed above with reference to FIG. 4 and the wavelength of the UV radiation 704 discussed above with reference to FIG. 7.

Referring to FIG. 1, the method 100 proceeds to block 120, where the trenches are filled with a conductive material to form conductive features. Referring to the example of FIG. 9, in some embodiments, a diffusion barrier layer 902 including titanium, titanium nitride, tantalum, tantalum nitride, other suitable materials, and/or combinations thereof may be formed in the trenches 808, 810, and 812. A conductive material may then be filled into the trenches 808, 810, and 812 over the diffusion barrier layer 902 and form conductive features 904, 906, and 908. The conductive features 904, 906, and 908 may be conductive lines, contacts, and/or vias. The conductive material may include aluminum, aluminum/silicon/copper alloy, metal silicide (such as nickel silicide, cobalt silicide, tungsten silicide, tantalum silicide, titanium silicide, platinum silicide, erbium silicide, palladium silicide, or combinations thereof), copper alloy, titanium, titanium nitride, tantalum, tantalum nitride, tungsten, polysilicon, gold, silver, and/or combinations thereof. In a particular example, copper is used as the conductive material. In furtherance of this example, a copper seed layer may be formed by physical vapor deposition (PVD). Thereafter, bulk copper is used to fill in the trenches 808, 810, and 812 by plating.

In some embodiments, a planarization process (e.g., a chemical mechanical polish (CMP)) may be performed after filling the conductive material, and the excess portions of the conductive material and diffusion barrier layer that are over the low-k dielectric layer 302 may be removed. In some embodiments, the bottom cap layer 502 may serve as a polishing stop layer and may be removed after the CMP process by an etch process.

In various embodiments, each of the conductive features 904, 906, and 908 may be connected to a device 204 in the substrate 202 by a contiguous conductive path (e.g., using conductive lines, contacts, and/or vias). In some examples, the conductive features 904, 906, and 908 may be electrically connected to different devices 204 through the MLI structure 210 including the conductive features 212. In some embodiments, the MLI structure 210 may be omitted, and the conductive features 904, 906, and 908 may be physically connected to the same device 204. For example, the conductive feature 904 may be physically connected to a source region of a transistor 204, the conductive feature 906 may be physically connected to a gate of the transistor 204, and the conductive feature 908 may be physically connected to a drain region of the transistor 204.

Figure 9:
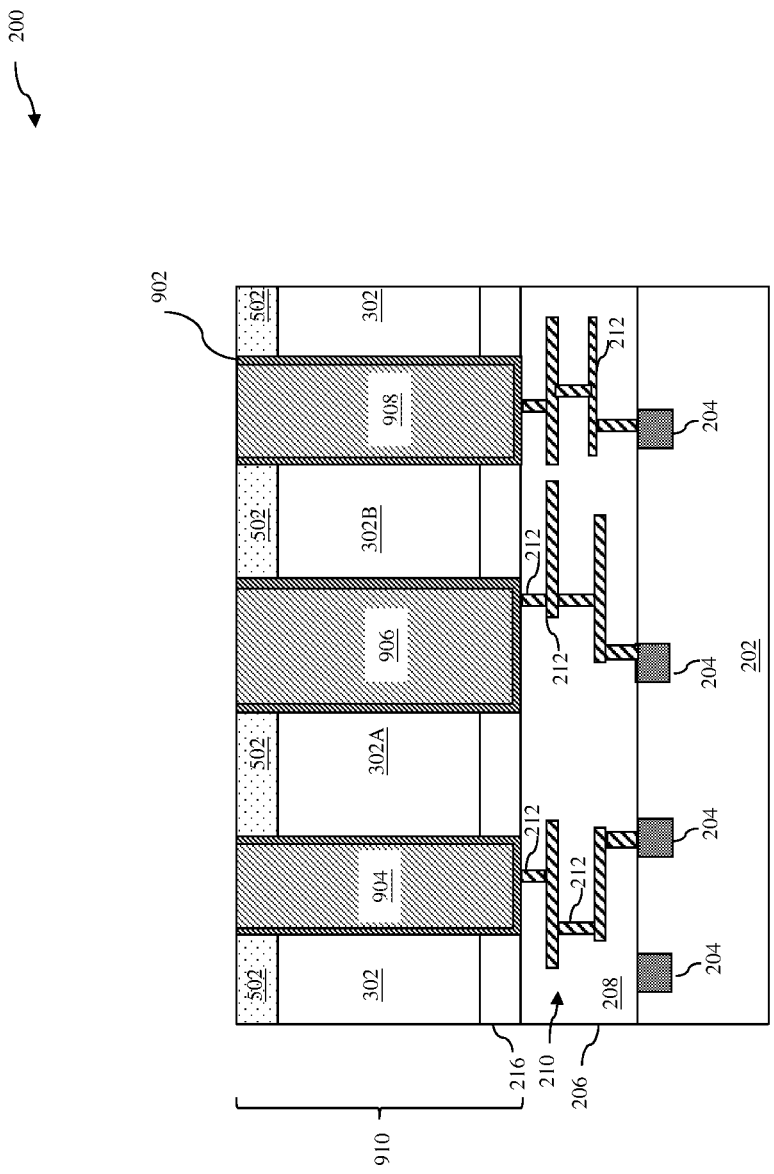
FIG. 9 is a cross-sectional view of a portion of a semiconductor device after filling the trenches with a conductive material according to some embodiments.

It is noted that the various features illustrated in FIG. 9 are not drawn to scale. For example, the dimensions of the conductive features 904, 906, and 908 are increased or reduced (e.g., increased relative to the conductive feature 212) for clarity of discussion and convenience in the drawings.

Referring to FIGS. 1, 10, 11, 12, and 13, in an exemplary embodiment of the method 100, a second connective layer 1306 may be formed. As illustrated in the example of FIGS. 10, 11, 12, and 13, the second connective layer 1306 may be formed over the first connective layer 910 in the device 200 over the substrate 202. In such embodiments, at block 114, it may be determined that a cap layer treatment process is not needed for the cap layers, and the method 100 may then proceed to block 122 to form trenches in the low-k dielectric layer.

It is noted that the various features illustrated in FIGS. 10, 11, 12, and 13 are not drawn to scale. For example, the dimensions of the conductive features 1302 and 1304 are increased or reduced (e.g., increased relative to the conductive features 212) for clarity of discussion and convenience in the drawings. Furthermore, the configurations and connections illustrated in FIGS. 10, 11, 12, and 13 are exemplary only and not intended to be limiting beyond what is specifically recited in the claims that follow. It will be understood by those skilled in the art that other configurations and connections may be chosen for a given device design or process technology, or other process conditions. In some embodiments, any number of connective layers (e.g., a layer including connective vias) may interpose the first connective layer 910 and the second connective layer 1306. In some embodiments, the second connective layer 1306 may be disposed directly on the first connective layer 910. While in the example of FIGS. 10, 11, 12, and 13, the second connective layer 1306 is formed after forming the first connective layer 910 and is disposed over the first connective layer 910, in some embodiments, the second connective layer 1306 is formed prior to the first connective layer 910, and is disposed under the first connective layer 910.

Figure 10:
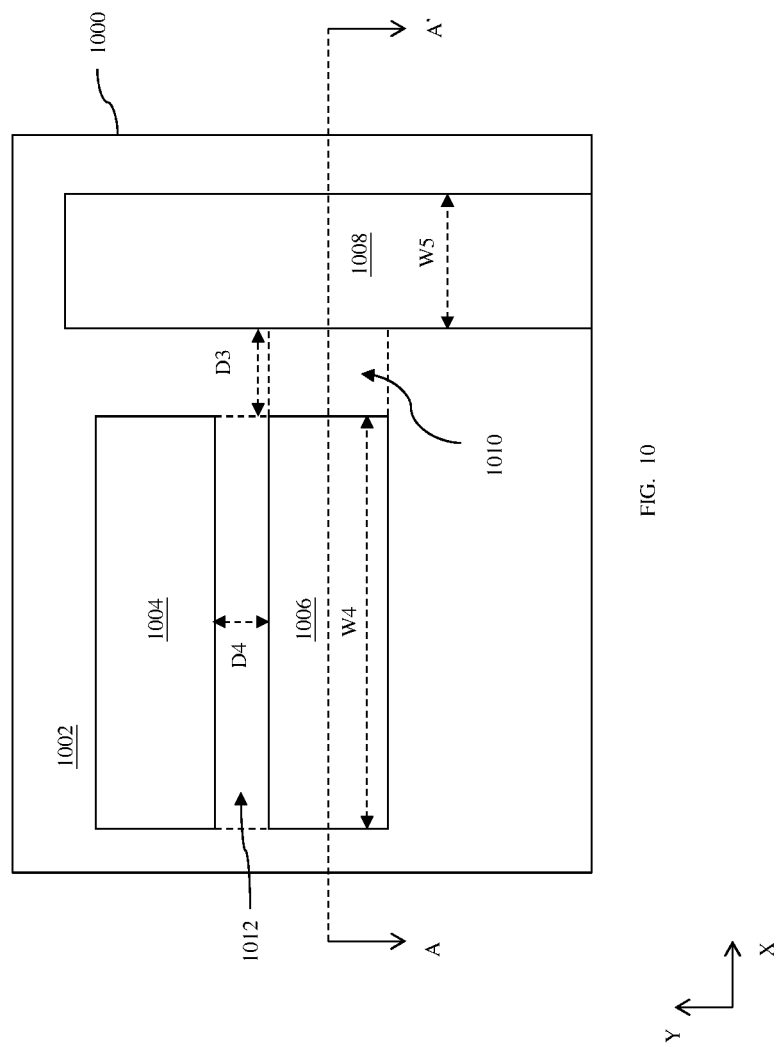
FIG. 10 is a layout of a portion of a semiconductor device according to an embodiment of the present disclosure.

Referring to FIGS. 1 and 10, at block 102, a layout 1000 associated with a second connective layer of the device 200 is provided. The layout 1000 may include patterns 1004, 1006, and 1008, which may define features of the second connective layer of an interconnect structure such as a multi-layer interconnect (MLI) structure. For example, the patterns 1004, 1006, and 1008 may define conductive features (e.g., conductive lines, contacts, and/or vias) in the second connective layer. The patterns 1004 and 1006 have a width w4, and the pattern 1008 may have a width W5. In some embodiments, each of the widths W4 and W5 may be between about 15 nm and about 100 nm. The layout 1000 may include an insulating area 1002 which may define an insulating layer (e.g., including a low-k dielectric material) that surrounds the conductive features defined by the patterns 1004, 1006, and 1008, and electrically insulates portions of those conductive features. The insulating area 1002 includes areas 1010 and 1012 interposing neighboring patterns. The area 1010 may interpose neighboring patterns 1006 and 1008 along the X direction, and have a width D3 along the X direction. The area 1012 may interpose neighboring patterns 1004 and 1006 in the Y direction, and have a width D4 along the Y direction. In some embodiments, the widths D3 and D4 may be between about 5 nm and about 50 nm.

Figure 11:
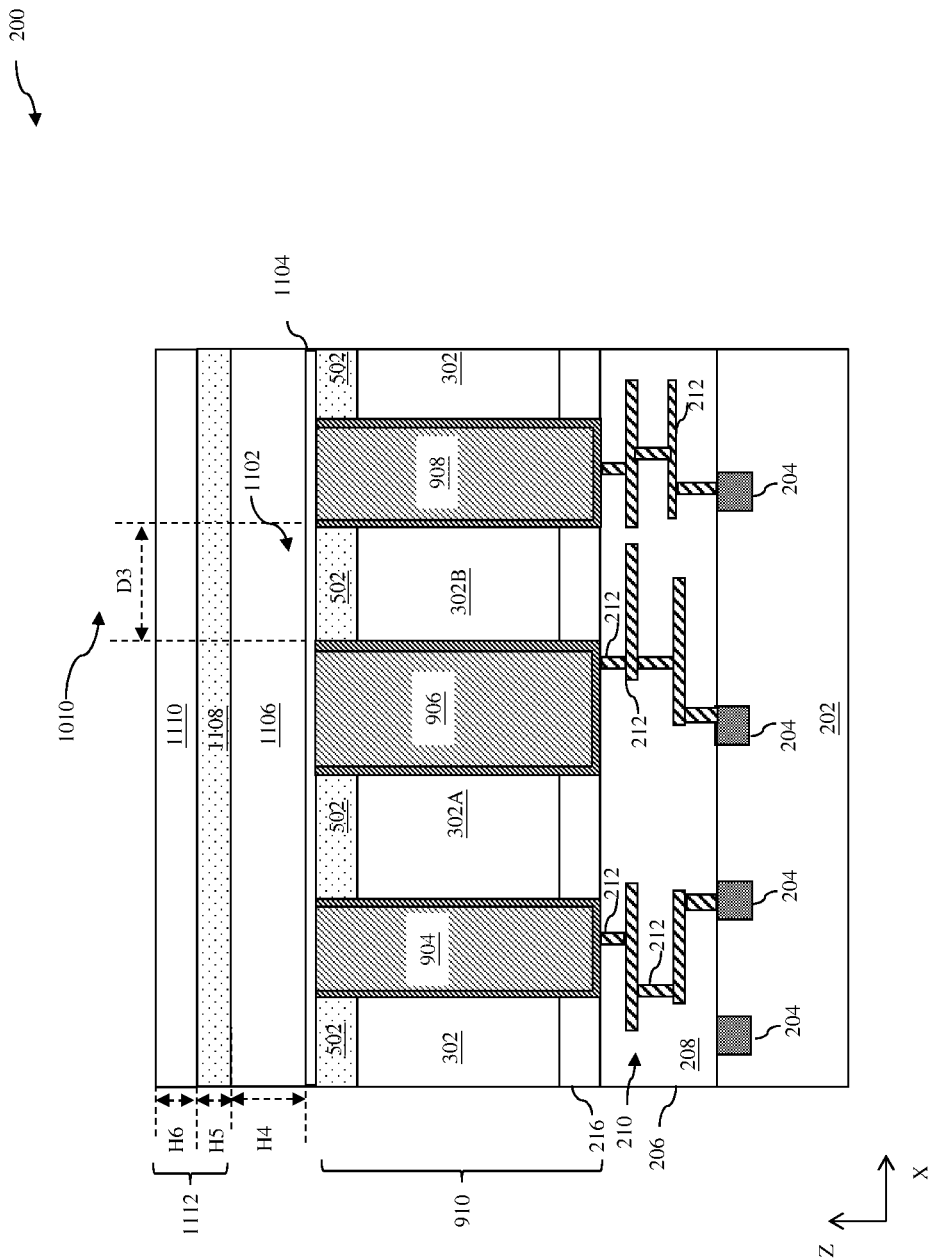
FIG. 11 is a cross-sectional view of a portion of a semiconductor device according to some embodiments.

Referring to FIGS. 1 and 11, the method 100 may proceed to blocks 104, 106, 108, 110, and 112 to form various layers over the first connective layer 910. The processes may be substantially similar to blocks 104, 106, 108, 110, and 112 described above with reference to FIGS. 3, 4, 5, and 6 except with the differences noted below. Referring to the example of FIG. 11, at block 104, an etch stop layer 1104 is formed over the first connective layer 910 at block 104. The etch stop layer 1104 may be substantially similar to the etch stop layer 216 described above with reference to FIG. 3. The method 100 then proceeds to block 106, where a low-k dielectric layer 1106 having a height H4 is formed over the etch stop layer 1104. The low-k dielectric material of the low-k dielectric layer 1106 may be substantially similar to the low-k dielectric material of the low-k dielectric layer 302 described above with reference to FIG. 3. The method 100 then proceeds to block 108, where a treatment process (e.g., a UV treatment) is performed to the low-k dielectric layer 1106. The treatment process performed to the low-k dielectric layer 1106 may be substantially similar to the treatment process performed to the low-k dielectric layer 302 described above with reference to FIG. 4. The method 100 then proceeds to block 110, where a bottom cap layer 1108 having a height H5 is formed over the low-k dielectric layer 1106 at block 110. The dielectric material of the bottom cap layer 1108 may be substantially similar to the dielectric material of the bottom cap layer 502 described above with reference to FIG. 5. The method 100 then proceeds to block 112, where a top cap layer 1110 having a height H6 is formed over the bottom cap layer 1108. The material of the top cap layer 1110 may be substantially similar to the material of top cap layer 602 described above with reference to FIG. 6. The bottom cap layer 1108 and the top cap layer 1110 may form a cap layer 1112.

In some embodiments, the method 100 then proceeds to block 114, where it is determined whether a cap layer treatment process is needed for the cap layer 1112. In some embodiments, the determination is based on various properties of the layout 1000, the low-k dielectric layer 1106, and the cap layer 1112 (including the bottom cap layer 1108 and the top cap layer 1110). Referring to FIG. 11, in some examples, the low-k dielectric layer 1106 includes low-k dielectric portion 1102 associated with the area 1010 of the layout 1000. The low-k dielectric portion 1102 may form a low-k dielectric area separated by trenches in a subsequent step. In some examples, the low-k dielectric portion 1102 has a height-to-width aspect ratio of H4:D3, and a low-k dielectric portion corresponding to the area 1012 of the layout 1000 has a height-to-width aspect ratio of H4:D4. In the embodiment illustrated in FIG. 11, it may be determined that a cap layer treatment process is not needed for the cap layer 1112 where D3 is about 20 nm, D4 is about 10 nm, H4 is about 30 nm, and the height-to-width aspect ratio threshold is about 5:1, because both height-to-width aspect ratios of the low-k dielectric portion 1102 (e.g., 30:20) and the height-to-width aspect ratio of a low-k dielectric portion corresponding to the area 1012 (e.g., 30:10) are less than the height-to-width aspect ratio threshold 5:1.

Figure 12A:
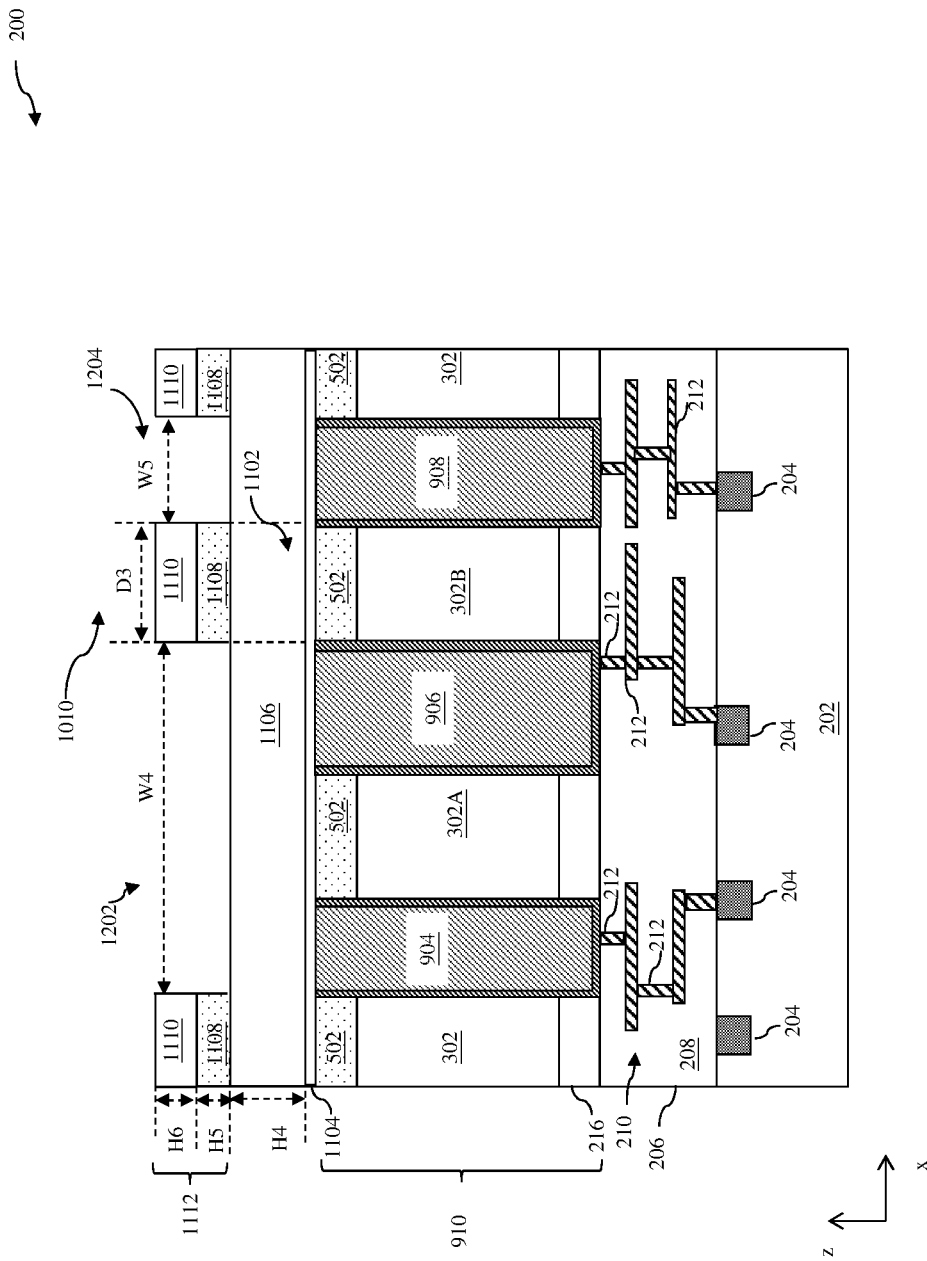
FIG. 12A is a cross-sectional view of a portion of a semiconductor device according to some embodiments.
Figure 12B:
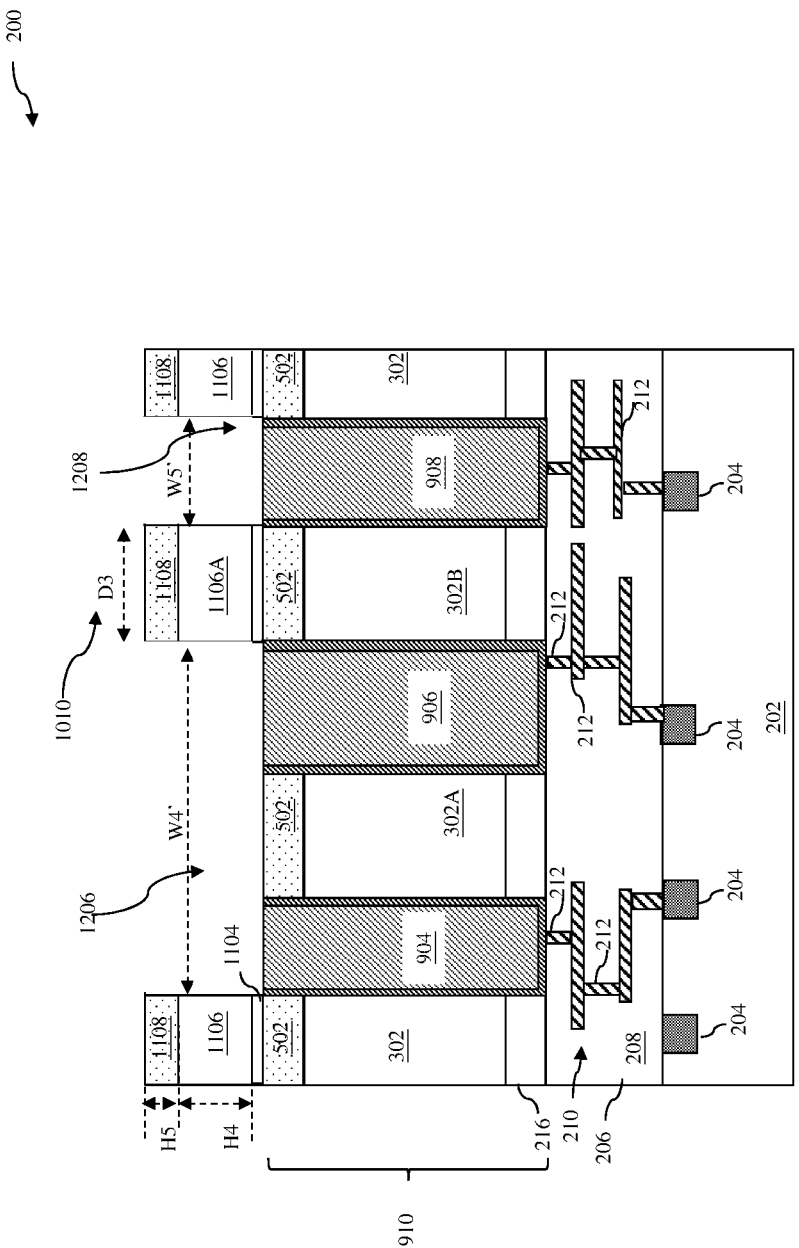
FIG. 12B is a cross-sectional view of a portion of a semiconductor device according to some embodiments.

Referring to FIGS. 1, 12A, and 12B, the method 100 then proceeds to block 122, where trenches are formed in the low-k dielectric layer 1106. Block 122 may be substantially similar to block 118 of the method 100.

Referring to the example of FIG. 12A, in an embodiment of block 122, a patterning process may be performed to pattern the cap layer 1112. For example, a photoresist layer may be formed over the top cap layer 1110 and patterned using the layout 1000. The patterned photoresist layer is then used as an etching mask to etch the top cap layer 1110 and bottom cap layer 1108. In some embodiments, the etching may stop on, or over, a top surface of the low-k dielectric layer 1106, thereby forming openings 1202 and 1204 in the top cap layer 1110 and the bottom cap layer 1108, and exposing portions of the top surface of the low-k dielectric layer 1106. The opening 1202 may have a width W4 and is associated with the pattern 1006 of the layout 1000. The opening 1204 may have a width W5 and is associated with the pattern 1008 of the layout 1000. The photoresist layer may be removed (e.g., using a wet etching or plasma ashing process), exposing the patterned top cap layer 1110.

Referring to the example of FIG. 12B, in some embodiments, an etching process may be performed to etch the low-k dielectric layer 1106, thereby forming trenches associated with the patterns of the layout 1000. During the etching process, the patterned top cap layer 1110 may be used as the etching mask. The etch process is properly chosen to form the trenches. For example, dry etch, wet etch, or a combination thereof, may be applied for transferring the openings 1202 and 1204 to the low-k dielectric layer 1106, forming the trenches 1206 and 1208. In some embodiments, the trenches 1206 and 1208 extend to a bottom surface of the low-k dielectric layer 1106 and the etch stop layer 1104. In some embodiments, conductive features in the first connective layer 910 (e.g., the conductive features 904, 906, and 908) is exposed in the trenches 1206 and 1208.

In some embodiments, the etching process performed to the low-k dielectric layer 1106 may not cause the low-k dielectric areas disposed between trenches (e.g., when the low-k dielectric areas have height-to-width aspect ratios less than the height-to-width aspect ratio threshold) of low-k dielectric layer 1106 to bend. As shown in the example of FIG. 12B, in some embodiments, the portion 1106A (also referred to as the low-k dielectric area 1106A) of the low-k dielectric layer 1106 remains substantially un-bent during the etching process. In the example of FIG. 12B, the trenches 1206 and 1208 have widths W4' and W5' at a top surface of the low-k dielectric layer 1106, which may be substantially the same as the widths W4 and W5 of the corresponding openings 1202 and 1204 prior to the etching is performed to the low-k dielectric layer 1206. In some examples, the difference between W4' and W4 is less than about 10% (e.g., less than about 2%) of the width W4, and the difference between W5' and W5 is less than about 10% (e.g., less than about 2%) of the width W5. In some examples, the difference between W4' and W4 and the difference between W5 and W5' are less than about 1 nm.

In some embodiments, after the trenches 1206 and 1208 are formed in the low-k dielectric layer 1106, a repair treatment process may be performed to the low-k dielectric layer 1106 to repair the damage caused to the low-k dielectric layer 1106 by the etching process. For example, the repair treatment process may include exposing the low-k dielectric layer 1106 (e.g., the sidewalls and the bottoms of the trenches 1206 and 1208) to a UV radiation. The repair treatment process may be substantially similar to the repair treatment process discussed above with reference to FIG. 8B after trenches 808, 810, and 812 are formed in the low-k dielectric layer 302.

Figure 13:
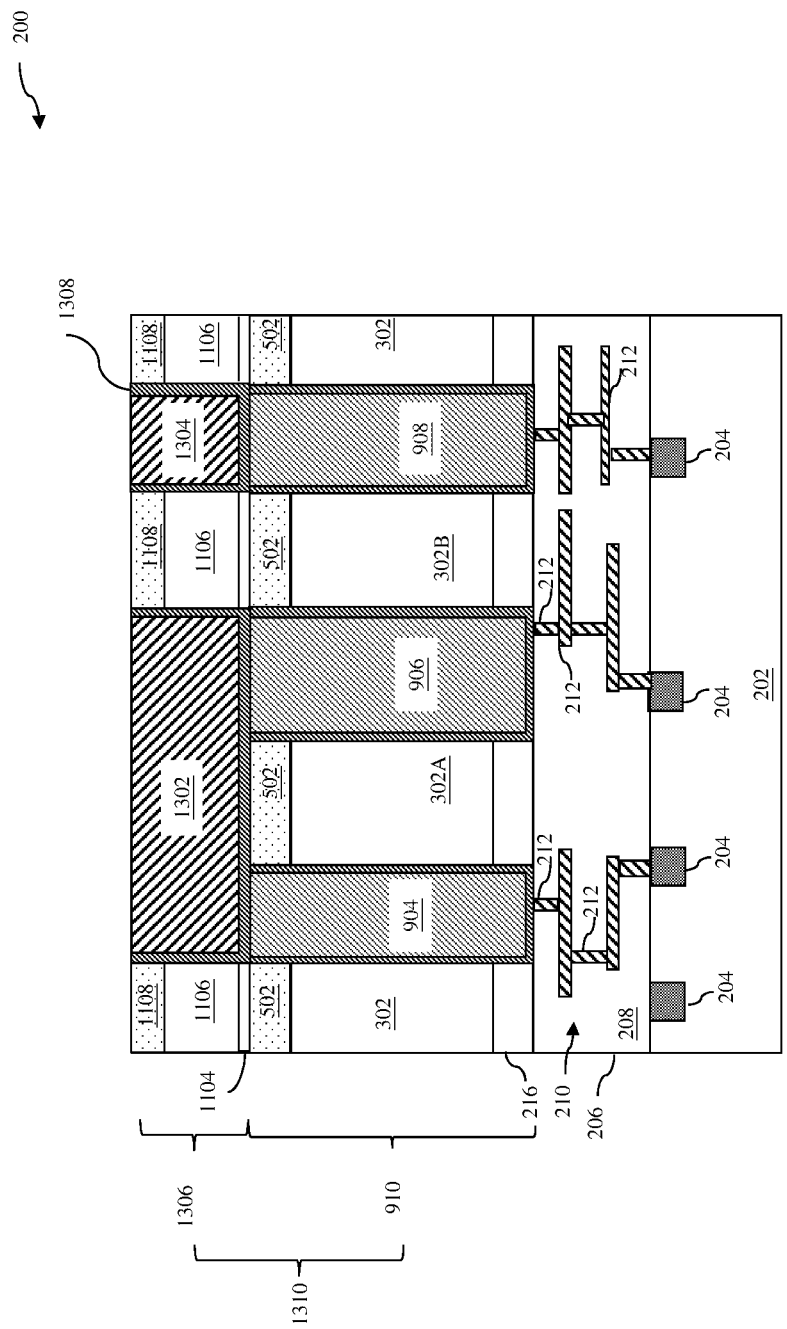
FIG. 13 is a cross-sectional view of a portion of a semiconductor device according to some embodiments.

Referring to FIGS. 1 and 13, the method 100 then proceeds to block 124, where the trenches are filled to form conductive features 1302 and 1304. The conductive features 1302 and 1304 may be conductive lines, contacts, and/or vias in the second connective layer 1306. Block 124 may be substantially similar to block 120 of the method 100. Referring to the example of FIG. 13, illustrated is a device 200 after the trenches 1206 and 1208 are filled with a conductive material. In some embodiments, a diffusion barrier layer 1308 including titanium, titanium nitride, tantalum, tantalum nitride, other suitable materials, and/or combinations thereof may be formed in the trenches 1206 and 1208. A conductive material may then be filled into the trenches 1206 and 1208 over the diffusion barrier layer 1306 and form conductive features 1302 and 1304 of the second connective layer 1306. The conductive material may be substantially similar to the conductive material of the conductive features 904, 906, and 908 discussed above with reference to FIG. 9. As illustrated in FIG. 13, in some embodiments, an interconnect structure 1310 including the first connective layer 910 and the second connective layer 1306 is disposed over the substrate 202.

In various embodiments, the conductive features 1302 and 1304 may be connected to various devices 204 in the substrate 202 (e.g., by a contiguous conductive path including conductive features). In some examples, the conductive feature 1302 may be connected to the conductive features 904 and 906, and be electrically connected to one or more devices 204 through the MLI structure 210 including the conductive features 212. In some examples, the conductive feature 1304 may be connected to the conductive feature 908, and be electrically connected to a device 204 in the substrate 202.

In some embodiments, a planarization process (e.g., a chemical mechanical polish (CMP)) may be performed after filling the conductive material, and the excess portions of the conductive material and diffusion barrier layer that are over the low-k dielectric layer 1106 may be removed. In some embodiments, the bottom cap layer 1108 may serve as a polishing stop layer and may be removed after the CMP process by an etch process.

Various advantages may be present in various applications of the present disclosure. No particular advantage is required for all embodiments, and that different embodiments may offer different advantages. One of the advantages in some embodiments is that the compressive stress induced by the cap layer to the low-k dielectric layer is reduced by performing a cap layer treatment process (e.g., a UV treatment process) to the cap layer prior to the etching process. For example, by reducing the stress induced by the cap layer to the low-k dielectric layer, under stress arising from various process conditions (e.g., etching), bending or merging of sidewalls of the low-k dielectric areas disposed between neighboring trenches is reduced. Another advantage in some embodiments is that whether a cap layer treatment process need to be performed on the cap layer may be determined based on various properties of the interconnect layout, the low-k dielectric layer, and the cap layer. In other words, in some embodiments, the cap layer treatment process may be omitted, thereby reducing production cost. Yet another advantage in some embodiments is that by choosing tuning the treatment conditions of the cap layer treatment process (e.g., UV treatment conditions) according to the materials of the cap layer (including the top cap layer and the dielectric layer), the reduced stress induced by the cap layer to the low-k dielectric layer may be achieved without affecting the performance of the low-k dielectric layer (e.g., without affecting the k value of the low-k dielectric layer).

Thus, the present disclosure provides an embodiment of a method of fabricating a semiconductor device. The method includes forming a low-k dielectric layer over a substrate, depositing a cap layer over the low-k dielectric layer, and performing a treatment process to the cap layer. After the treatment process is performed to the cap layer, the low-k dielectric layer is etched to form a trench using the cap layer as an etching mask.

The present disclosure also provides an embodiment of a method of forming a semiconductor device. The method includes providing a layout of a connective layer including a first pattern and a second pattern adjacent to the first pattern. A dielectric area having a first width is disposed between the first pattern and the second pattern. A low-k dielectric layer having a height is formed over a substrate. A cap layer is deposited over the low-k dielectric layer. After it is determined that a ratio between the first width and the height is less than a pre-defined height-to-width aspect ratio threshold, a top surface of the cap layer is irradiated with a first radiation. After the irradiating the top surface of the cap layer with the first radiation, the cap layer is patterned to form a first opening associated with the first pattern and a second opening associated with the second pattern. An etching process is performed to transfer the first opening to a first trench in the low-k dielectric layer and transfer the second opening to a second trench in the low-k dielectric layer.

The present disclosure further provides an embodiment of a method of forming a semiconductor device. The method includes forming a low-k dielectric layer over a substrate, depositing a cap layer having a first hardness over the low-k dielectric layer and performing a treatment process to the cap layer. After the performing the treatment process, the cap layer has a second hardness different from the first hardness. After the performing the treatment process to the cap layer, the low-k dielectric layer is etched to form a trench using the cap layer as an etching mask.

Although the present disclosure and advantages of some embodiments have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of fabricating a semiconductor device, comprising:
   forming a low-k dielectric layer;
   depositing a cap layer over the low-k dielectric layer, the depositing the cap layer includes:
      forming a bottom cap layer over the low-k dielectric layer; and
      forming a top cap layer of the cap layer over the bottom cap layer, wherein the top cap layer includes a metal;
   etching the low-k dielectric layer to form a first trench and a second trench using the cap layer as an etching mask.

2. The method of claim 1, wherein the bottom cap layer includes silicon oxycarbide.

3. The method of claim 1, further comprising:
   prior to the etching the low-k dielectric layer, performing a treatment process to the cap layer.

4. The method of claim 1, further comprising:
   prior to the etching the low-k dielectric layer, performing a treatment process to the cap layer;
   wherein the cap layer induces a first stress on the low-k dielectric layer prior to the performing the treatment process,
   wherein the cap layer induces a second stress different from the first stress on the low-k dielectric layer after the performing the treatment process, and
   wherein an absolute value of the second stress is less than about 50% of an absolute value of the first stress.

5. The method of claim 4, further comprising:
   prior to the performing the depositing the cap layer, performing a second treatment process to the low-k dielectric layer to change a dielectric constant of the low-k dielectric layer.

6. The method of claim 5, wherein during the performing the treatment process, the dielectric constant of the low-k dielectric layer remains substantially the same.

7. The method of claim 6, further comprising:
   after the etching the low-k dielectric layer to form the first and second trenches, irradiating sidewalls and bottoms of the first and second trenches with a third radiation to change the dielectric constant of the low-k dielectric layer.

8. A method, comprising:
   providing a layout of a connective layer including a first pattern having a first width in a first direction and a second pattern disposed at a distance from the first pattern in the first direction;
   forming a low-k dielectric layer having a height over a substrate;
   depositing a cap layer over the low-k dielectric layer;
   irradiating a top surface of the cap layer with a first radiation;
   patterning the cap layer to form a first opening associated with the first pattern and a second opening associated with the second pattern; and
   performing an etching process to transfer the first opening to a first trench in the low-k dielectric layer and transfer the second opening to a second trench in the low-k dielectric layer.

9. The method of claim 8,
   wherein a ratio between the height and the distance is greater than a pre-defined height-to-width aspect ratio threshold; and
   wherein the pre-defined height-to-width aspect ratio threshold is greater than about 5:1.

10. The method of claim 9, wherein after the performing the etching process, the first trench has a second width at a top surface of the low-k dielectric layer, and
    wherein the first width and the second width are substantially the same.

11. The method of claim 10, wherein a difference between the first width and the second width is less than about 10% of the first width.

12. The method of claim 11, further comprising:
    prior to the depositing the cap layer, irradiating the low-k dielectric layer with a second radiation.

13. The method of claim 12, wherein the second radiation has a second wavelength different from a first wavelength of the first radiation.

14. The method of claim 13, further comprising:
after the etching the low-k dielectric layer to form the first trench and the second trench, irradiating sidewalls and bottoms of the first trench and the second trench with a third radiation to change a dielectric constant of the low-k dielectric layer.

15. The method of claim 14, wherein the third radiation has a third wavelength different from the first wavelength of the first radiation.

16. A method, comprising:
forming a low-k dielectric layer over a substrate;
forming a lower cap layer over the low-k dielectric layer;
forming an upper cap layer over the lower cap layer; and
performing a first treatment process to the cap layer,
   wherein the lower cap layer has a first hardness prior to the first treatment process and a second hardness greater than the first hardness after the first treatment process; and
   wherein during the first treatment process, a dielectric constant of the low-k dielectric layer remains substantially the same; and
etching the low-k dielectric layer to form a plurality of trenches using the cap layer as an etching mask.

17. The method of claim 16, further comprising:
prior to the performing the depositing the cap layer, performing a second treatment process to the low-k dielectric layer to change the dielectric constant of the low-k dielectric layer.

18. The method of claim 16, wherein the performing the first treatment process includes:
irradiating an ultraviolet (UV) radiation on the cap layer.

19. The method of claim 16, wherein the lower cap layer includes silicon oxycarbide.

20. The method of claim 16, wherein the upper cap layer includes a metal.

* * * * *